United States Patent
Zhou et al.

(10) Patent No.: US 9,846,214 B2
(45) Date of Patent: Dec. 19, 2017

(54) MAGNETIC RESONANCE IMAGE RECONSTRUCTION FOR UNDERSAMPLED DATA ACQUISITIONS

(71) Applicant: Toshiba Medical Systems Corporation, Tochigi (JP)

(72) Inventors: Yihang Zhou, Tonawanda, NY (US); Aiming Lu, Vernon Hills, IL (US); Mitsue Miyazaki, Des Plaines, IL (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 543 days.

(21) Appl. No.: 14/584,427

(22) Filed: Dec. 29, 2014

(65) Prior Publication Data

US 2016/0187446 A1 Jun. 30, 2016

(51) Int. Cl.
G01R 33/56 (2006.01)
G01R 33/561 (2006.01)

(52) U.S. Cl.
CPC .................... G01R 33/5611 (2013.01)

(58) Field of Classification Search
CPC .............. A61B 5/7257; G01R 33/5611; G01R 33/4818; G01R 33/5608; G01R 33/246; G01R 33/5619; G01R 44/243; G01R 33/4824; G01R 33/4826; G01R 33/50; G01R 33/546; G01R 33/56; G01R 33/56308

See application file for complete search history.

(56) References Cited

U.S. PATENT DOCUMENTS

| 7,777,487 | B2 | 8/2010 | Ying et al. |
| 8,717,024 | B2 | 5/2014 | King et al. |
| 2009/0262996 | A1* | 10/2009 | Samsonov ......... G01R 33/4818 382/130 |
| 2013/0099786 | A1* | 4/2013 | Huang ................. G01R 33/246 324/309 |
| 2013/0289912 | A1* | 10/2013 | Liu ...................... G01R 33/246 702/65 |

(Continued)

FOREIGN PATENT DOCUMENTS

WO  WO 2011116785  9/2011

OTHER PUBLICATIONS

Uecker et al., "Image Reconstruction by Regularized Nonlinear Inversion—Joint Estimation of Coil Sensitivities and Image Content". Magnetic Resonance in Medicine, 60(3): pp. 674-682, 2008.
Uecker et al., "Nonlinear Inverse Reconstruction for Real-Time MRI of the Human Heart Using Undersampled Radial Flash", Magnetic Resonance in Medicine 63:1456-1462 (2010).

(Continued)

*Primary Examiner* — Clayton E Laballe
*Assistant Examiner* — Ruifeng Pu
(74) *Attorney, Agent, or Firm* — Nixon & Vanderhye P.C.

(57) ABSTRACT

Magnetic resonance imaging (MRI) systems and methods to effect improved MR image reconstruction for undersampled data acquisitions are described. The improved MR image reconstruction is performed by iteratively using compressed sensing to reconstruct an MR image based upon at least one sensitivity map by minimizing a predetermined function which is based upon the MR image and coefficients of the at least one sensitivity map, and updating the at least one sensitivity map by minimizing the predetermined function.

19 Claims, 5 Drawing Sheets

(56) References Cited

U.S. PATENT DOCUMENTS

| | | | |
|---|---|---|---|
| 2014/0097845 A1* | 4/2014 | Liu | G01R 33/5611 |
| | | | 324/322 |
| 2015/0285889 A1* | 10/2015 | Chen | A61B 5/055 |
| | | | 324/309 |
| 2015/0287222 A1* | 10/2015 | Zhao | G01R 33/5619 |
| | | | 382/131 |
| 2016/0054418 A1* | 2/2016 | Doneva | G01R 33/4818 |
| | | | 324/309 |
| 2016/0267689 A1* | 9/2016 | Ye | G06T 11/008 |
| 2017/0178318 A1* | 6/2017 | Wang | G06T 7/0012 |

OTHER PUBLICATIONS

Pruessmann et al., "Advances in Sensitivity Encoding With Arbitrary K-Space Trajectories", Magnetic Resonance in Medicine 46:638-651 (2001).

Lustig et al., "Sparse MRI: The Application of Compressed Sensing for Rapid MR Imaging", Magnetic Resonance in Medicine 58:1182-1195 (2007).

Donoho, David L, IEEE Trans. Info. Theory 52(4):1289-1306.

Liu, L.Y.B., Zou, Y.M., "SparseSENSE: application of compressed sensing in parallel MRI", Proc. IEEE International Conference on Technology and Applications in Biomedicine, Shenzhen, China, 2008, pp. 127-130.

Uecker et al., "Image reconstruction by regularized nonlinear inversion—Joint estimation of coil sensitivities and image content". Magn. Reson. Med., 60(3): pp. 674-682, 2008.

Walsh et al., "Adaptive Reconstruction of Phased Array MR Imagery", Magnetic Resonance in Medicine 43:682-690 (2000).

* cited by examiner

MAGNETIC RESONANCE IMAGE RECONSTRUCTION FOR UNDERSAMPLED DATA ACQUISITIONS

FIELD

The subject matter below relates generally to magnetic resonance imaging (MRI), and more particularly to systems and methods for improved MR image reconstruction for undersampled data acquisitions.

DETAILED DESCRIPTION

Figure 1:
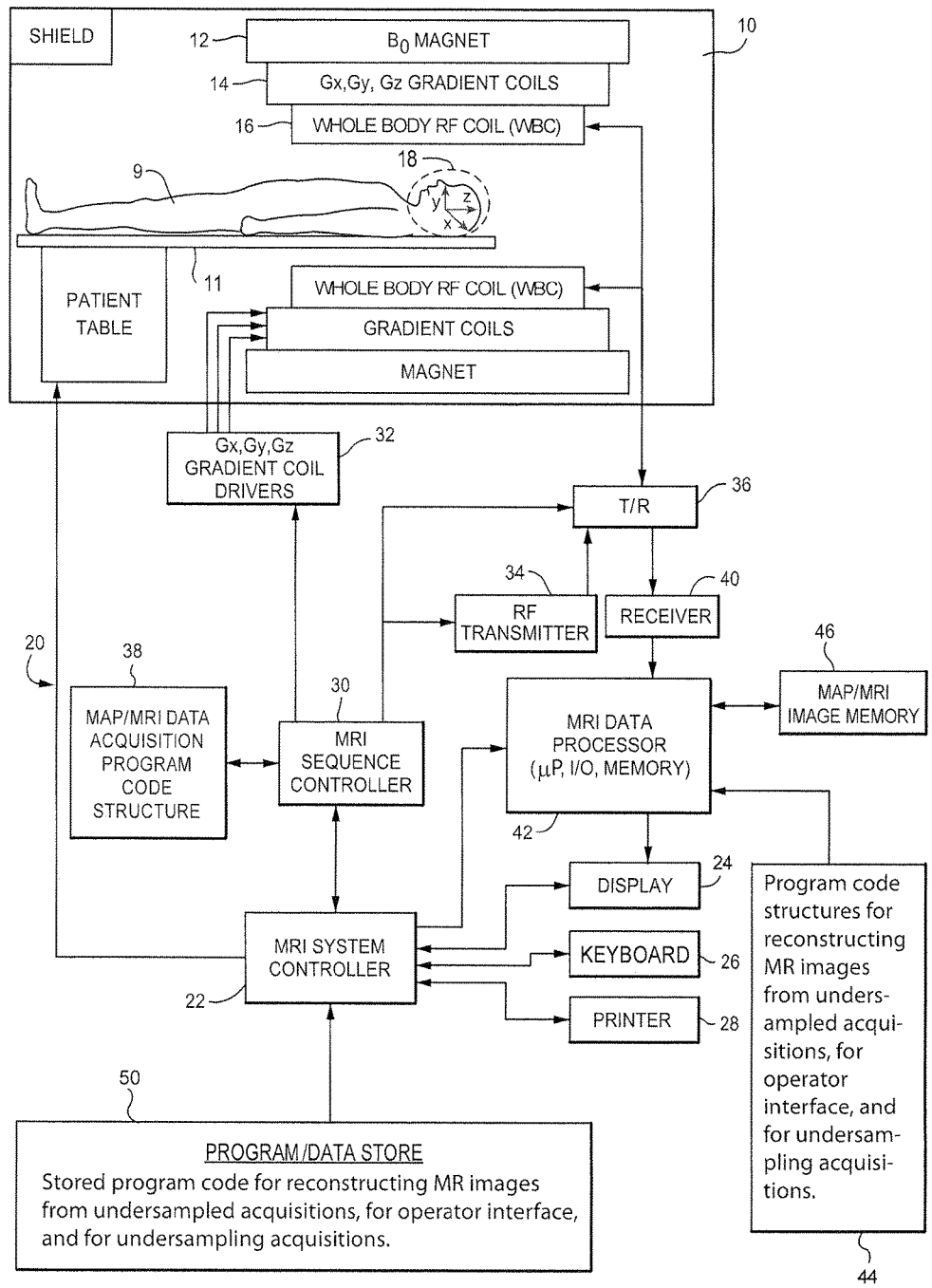
FIG. 1 is a high-level schematic block diagram of an MRI system adapted for improved for improved MR image reconstruction for undersampled data acquisitions, in accordance with one or more embodiments.

Example embodiments of the subject matter disclosed herein provide for improved MR image reconstruction for undersampled data acquisitions. In embodiments, the coil sensitivities and the image are jointly and iteratively updated until a satisfactory image is obtained.

Radial acquisition based MRI has gained significant interest from both academia and industry. Radial acquisition provides many benefits including: ultra-short or zero echo time, capability for imaging short T2/T2* species, robustness to motion and flow artifacts, resilience to angular undersampling artifacts, and the capability to significantly reduce acoustic noise (e.g., silent scan), etc. However, radial acquisitions require significantly more repetitions to satisfy the Nyquist sampling criterion. Angular undersampling (e.g., circumferential density of samples at only 40% of the Nyquist sampling limit at ⅔ of the radius from center k-space, or 30-degree angle between consecutive radial lines) is usually used to accelerate data acquisition with often resultant streaking artifacts or diffused background noise.

Advanced image reconstruction methods such as parallel imaging (see e.g., Pruessmann, K P., et al. MRM 46.4 (2001): 638-651, hereinafter "Pruessmann, and Ying and Sheng, U.S. Pat. No. 7,777,487 B2, hereinafter '487 patent"), compressed sensing (see e.g., Donoho, David L, IEEE Trans. Info. Theory 52(4):1289-1306 and Lustig, Michael, et al, MRM 58.6 (2007): 1182-1195, hereinafter "Lustig et al."), or the combination of some of these methods (see e.g., King and Xu, U.S. Pat. No. 8,717,024 B2) have been proposed to reduce undersampling artifacts and improve the image quality of MRI images obtained from undersampled acquisitions. The '487 patent and Lustig et al. are hereby incorporated by reference in their entirety.

Embodiments of the subject matter disclosed herein operate to improve the quality of MR images obtained from undersampled signal acquisitions including, but not limited to, undersampled 3D Radial acquisitions. As noted above, although it has many clinically useful advantages, radial acquisition often requires angular undersampling in order to shorten the acquisition time due to patient comfort and other factors. The usually vastly undersampled k-space data in radial acquisitions frequently manifests as streaking artifacts or diffused background noise in images reconstructed from sum of square of images of individual coils. Parallel imaging technique such as SENSE described in Pruessmann et al. and JSENSE described in the '487 patent, can reduce undersampling artifacts, but may amplify image noise. Moreover, the imperfect estimation of the coil sensitivity map(s) may introduce extra artifacts to the reconstructed images.

The application of compressed sensing theory in MRI, the SparseMRI, described in Lustig et al., is another technique that is often used to reduce undersampling artifacts. In SparseMRI, as described in Lustig et al., one measures a small number of random linear combinations of the signal values-much smaller than the number of signal samples nominally defining it. The signal is reconstructed with good accuracy from these measurements by a nonlinear procedure. In MRI, the sampled linear combinations are simply individual Fourier coefficients (k-space samples). Lustig et al. notes that CS is claimed to be able to make accurate reconstructions from a small subset of k-space rather than an entire k-space grid. Also according to Donoho, CS requires that: (a) the desired image have a sparse representation in a known transform domain (i.e., is compressible), (b) the aliasing artifacts due to k-space undersampling be incoherent (noise like) in that transform domain. (c) a nonlinear reconstruction be used to enforce both sparsity of the image representation and consistency with the acquired data.

Although the simple combination of compressed sensing and parallel imaging, as for example, described in the '024 patent, can reduce noise, such simple combination may also introduce artifacts. Furthermore, with inappropriate setting of the parameters for the penalty terms, the use of compressed sensing can cause image feature loss.

In contrast to conventional techniques, some embodiments combine joint estimation of coil sensitivities and image reconstruction by compression sensing in an iterative manner. Certain embodiments utilize coil sensitivities and other prior knowledge, such as image sparsity, in order to reduce undersampling artifacts and to improve the image quality yielded from radial acquisitions.

Embodiments enable the exploitation of all, or substantially all, the benefits of 3D radial acquisitions with significantly improved image quality. By using the over-sampled k-space center data in radial acquisition to generate one or more sensitivity maps. Embodiments eliminate the requirement for an additional data acquisition before or after the diagnostic data acquisition of many conventional radial MRI imaging techniques. The elimination of data acquisition that is separate from the diagnostic data acquisition, also eliminates the risks of artifacts due to motion occurring between the acquisitions of the sensitivity map data and image data.

Figure 3:
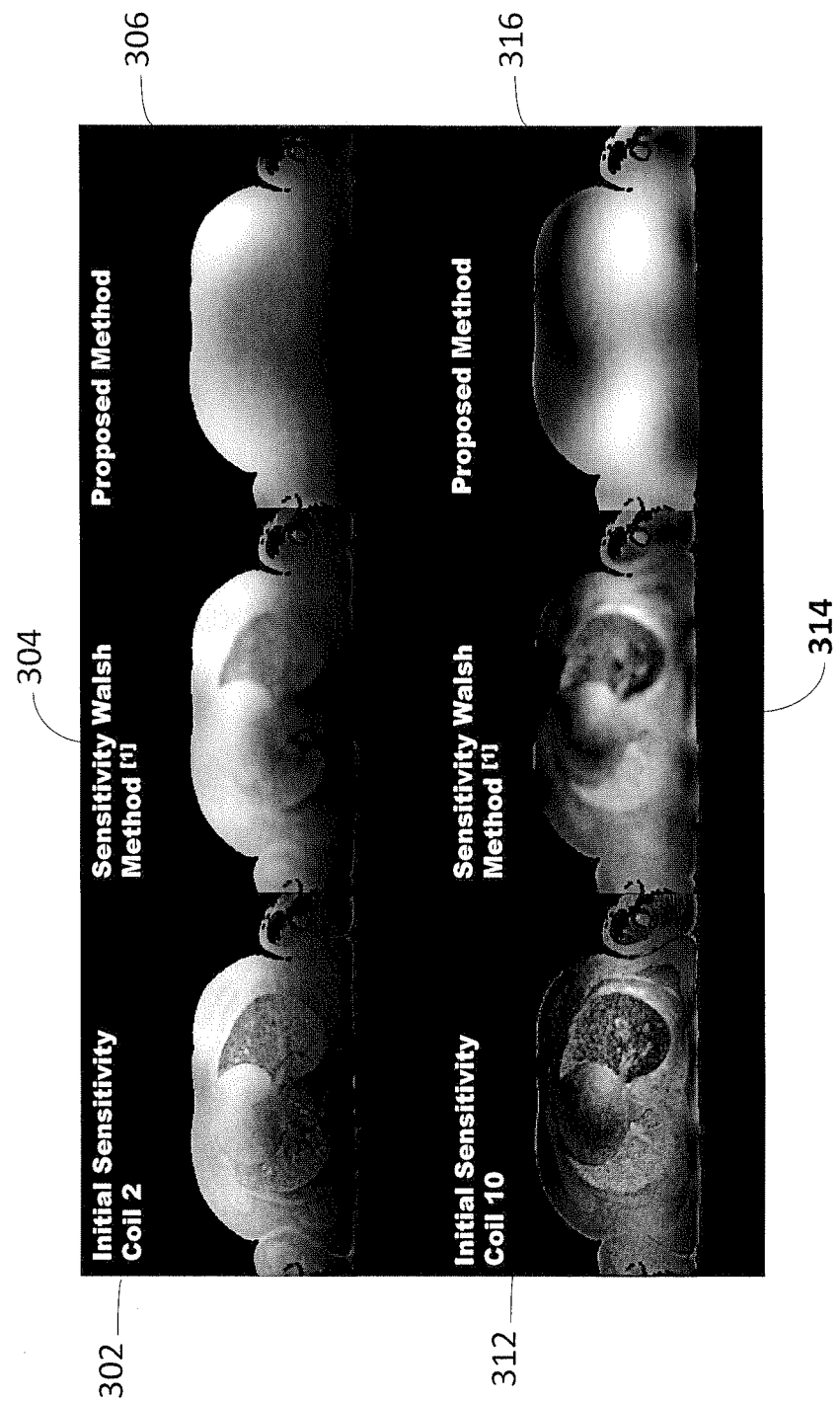
FIG. 3 provides example illustrations of coil sensitivity map improvements obtained according to some embodiments.

As shown in FIGS. 3-5, example embodiments may achieve better estimation of coil sensitivity maps, and may consequently result in improved image reconstruction. Compared with many existing reconstruction methods, example embodiments may reduce undersampling artifacts, and improve image SNR and image features. Moreover, example embodiments do not require significant additional computation complexity when compared to conventional techniques. An example implementation of an embodiment yielded 5-10 minutes computation time with GPU and C/C++ implementation, which is comparable or equivalent to the computations required for conventional methods such as SparseSENSE. See e.g., Liu, L. Y. B., Zou, Y. M., "SparseSENSE: application of compressed sensing in parallel MRI", Proc. IEEE International Conference on Technology and Applications in Biomedicine, Shenzhen, China, 2008, pp. 127-130, and the '024 patent.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body radio frequency (RF) coil (WBC) assembly 16. Along the horizontal axis of this cylindrical array of elements is an imaging volume 18 shown as substantially encompassing the anatomy of interest (i.e., region of interest or "ROI") for a patient 9 supported by a patient table 11.

In some embodiments, a smaller array RF coil (not shown) might be coupled to a portion of the patient such that the imaging volume would include the area encompassed by the smaller array RF coil. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and one or more receiver coils configured to receive RF signals from the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22, or a computer coupled to the MRI system controller 22, may be operated to provide the MRI sequence controller 30 information about a pulse sequence and/or to manage the operations of the entire system, according to installed software programs. The MRI system controller 22 may also serve as an element for instructing a patient to perform tasks, such as, for example, a breath hold by a voice massage produced using an automatic voice synthesis technique.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques. The MRI imaging techniques may include, for example, parallel imaging and/or other imaging sequences.

The pulse-sequence information includes information required for operating the Gx, Gy and Gz gradient coil drivers 32, as well as the RF transmitter 34 and the transmit/receive switch 36 (if the same RF coil is used for both transmission and reception) according to a pulse sequence. Such information includes the strength, duration, and application timing of pulsed currents applied to the x-, y-, and z-coil. A duty cycle or TR is also controlled by the system controller 22 and/or sequence controller 30. The transmission of pulse sequences, duty cycle etc. may be controlled by the MRI system controller 22, MRI sequence controller 30, and/or MRI data processor 42 based on, for example, program code for a signal acquisition pattern such as, for example, Cartesian acquisition, spiral acquisition and radial acquisition.

The MRI system 20 includes an RF receiver 40 providing input to data processor 42 so as to create processed image data, which is sent to display 24. The MRI data processor 42 is also configured for access to system configuration parameters 46, program code structures 44 and program/data store 50. MRI program code structures 44 and 50 may, in addition to control logic for reconstructing MRI images, also include control logic to obtain MR data from RF coils 16 and/or any other receive coils. Process such as, for example, process 200 described below in relation to FIG. 2 can be performed by the MRI system controller 22, MRI sequence controller 30, and/or MRI data processor 42.

Although shown in FIG. 1 as being located away from the RF coil 16, in some embodiments, any of RF transmitter 34, transmit/receive switch 36, and RF receiver 40 may be located in close proximity to, or on a surface of, the RF coils 16 and/or other RF coil.

Also illustrated in FIG. 1 is a generalized depiction of an MRI system program/data store 50 where stored program code structures (e.g., for controlling data acquisition, for improved image reconstruction for undersampled acquisitions, for defining graphical user interfaces (GUI), accepting operator inputs), and configured or predetermined data (e.g., certain threshold settings for controlling program execution, parameters for controlling the joint estimation of coil sensitivity and image reconstruction by compressed sensing) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a coil sensitivity map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

Figure 2:
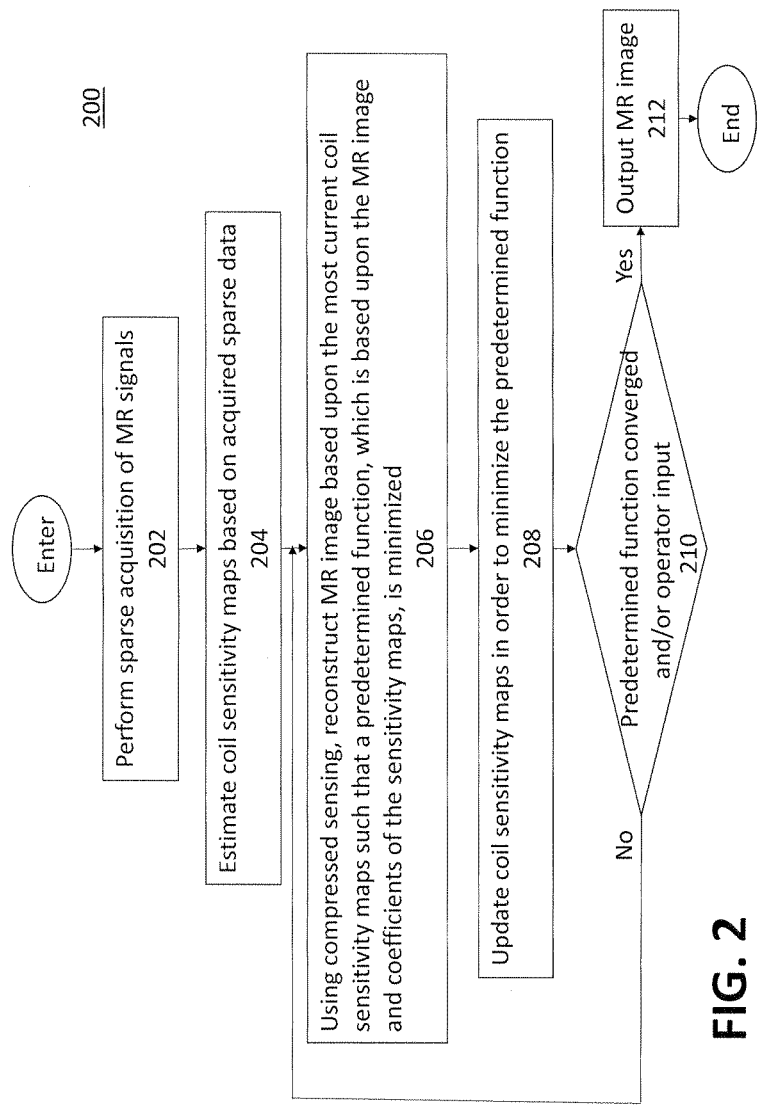
FIG. 2 illustrates a flowchart of a process to generate improved MR image reconstruction for undersampled data acquisitions, in accordance with one or more embodiments.

FIG. 2 illustrates a flowchart of a process 200 for improved MRI imaging with undersampled signal acquisitions, according to one or more embodiments. Operations 202-212 may be performed and/or controlled by MRI data processor 42, MRI system controller 22, and/or MRI sequence controller 30 shown in FIG. 1.

After entry to the improved MRI imaging with undersampled signal acquisitions routine, at operation 202, MRI signals are acquired from receiving coils. In parallel imaging embodiments, signals are acquired simultaneously through a plurality of receiving coils. The signals may be acquired using a radial acquisition. As described above, radial acquisitions result in a highly undersampled k-space. However, radial acquisitions have a concentration of signal acquisitions in the center k-space and have sparser signal acquisition as the distance from the center increases. The sparsely acquired data is stored in memory in a respective k-space corresponding to each receiving coil.

At operation 204, an initial sensitivity estimation is performed. As noted above reconstructing a diagnostic MR image from data obtained by parallel acquisition requires that the individual sensitivities of each coil be accounted for in generating the diagnostic MR image. Many conventional techniques acquire coil sensitivity calibration data through a separate calibration scan, which adds to the total scan time, or by acquiring some additional calibration lines during the actual scan. However, in some embodiments, the radial acquisition inherently samples the center k-space at the Nyquist rate or higher, and samples the areas away from the center at rates lower than Nyquist.

Operation 204 includes determining an initial sensitivity map for each receiving coil as a sensitivity function represented by a parametric model with a set of unknown parameters. In some embodiments, the techniques proposed in the '487 patent in relation to 3D JSENSE are used to initialize the sensitivity estimation.

For example, low resolution sum of square (sos) images and images of each coil are obtained by applying inverse non-uniform Fast Fourier transform (inverse NUFFT) on the acquired radial k-space data. In some embodiments, another technique such as, but not limited to, regridding may be applied on the acquired radial k-space data in order to obtain the low resolution images. The low resolution images are used to generate the initial coil sensitivity based upon the following formula.

$$S_i = \frac{I_i^{LR}}{I_{sos}^{LR}} \qquad (1)$$

where $S_i$ is the sensitivity (e.g., sensitivity map) of coil i, subscript i denotes the coil index, I is the image, and superscript LR represents the low resolution image. The low resolution image, according to some embodiments, is based upon the center k-space of the acquired radial data, and may or may not account for the areas outside of the center k-space.

The coil sensitivity maps estimated from Eq. (1) are used to compute the linear interpolation using Eq. (2) below.

$$S_i(\vec{r}) = \sum_{i,j,k} a_{l,i,j,k}(x_n - \bar{x})^i (y_n - \bar{y})^j (z_n - \bar{z})^k \qquad (2)$$

where $\vec{r}=(x,y,z)$ represents the location of a pixel, $(\bar{x},\bar{y},\bar{z})$ represents the averaged location, and $a_{l,i,j,k}$ is the coefficient of a polynomial forming the unknown vector a representing the sensitivities. The '487 patent presents versions of Eq. (2). In some other embodiments, a function other than a linear interpolation may be used to determine S.

At operation 206, image estimation which utilizes compressed sensing is performed. The image may be reconstructed by minimizing a predetermined function which is based upon the image and coefficients of the sensitivity maps. For example, the image reconstruction may be performed using function represented by Eq. (3) below.

$$\operatorname*{argmin}_{a_l, x} \sum_{l=1}^{C} \|d - E(a_l)x\|_2 + \lambda_1 \|\Phi x\|_1 + \lambda_2 TV_{3D}(x) \qquad (3)$$

where $\Phi$ is a 3D sparsifying transform that may include, but is not limited to, wavelet transform, Discrete Cosine Transform (DCT), Principle Component Analysis (PCA), and finite-differences. Parameter d is the acquired radial k-space data, E represents an operator which integrates both the Fourier transform with a specified radial trajectory and the coil sensitivity modulation estimated using Eq. (2), and x is the 3D image that is being developed which will, at the end of process 200, be output as the diagnostic MR image. The operator $TV_{3D}$ represents taking the gradient of the image along each direction phase encode (PE), frequency encode (FE), and spatial encode (SE). Specifically, the total variation of a 3D image is given by the L1 norm of the discrete gradient of the image that can be expressed as $$TV_{3D}(x_{(i,j,k)}) = \sum_{i,j,k=1}^{N,M,K} \sqrt{(G_x x)^2 + (G_y x)^2 + (G_z x)^2} \qquad (4)$$

where $x_{(i,j,k)}$ is the intensity value at voxel (i,j,k) {i=0, 1, 2, ..., N, j=0, 1, 2, ..., M and k=0, 1, 2, ..., K} and $(G_x x) = x_{(i,j,k)} - x_{(i+1,j,k)}$, $(G_y x) = x_{(i,j,k)} - x_{(i,j+1,k)}$, and $(G_z x) = x_{(i,j,k)} - x_{(i,j,k+1)}$. The minimization is for the summation of sensitivity maps $a_l$ corresponding to RF coils l=1 to C. $\lambda_1$ and $\lambda_2$ may be configurable. In an embodiment, $\lambda_1$ and $\lambda_2$ may be set to a value such as 0.001% of the SNR. Suitable values for $\lambda_1$ and $\lambda_2$ can be determined by setting all three terms of Eq. (3) to the same magnitude. The resulting reconstructed MR image x is modulated according to the most current, that is latest coil (i.e., just previously generated), sensitivity maps.

At operation 208, Eq. (3) is used to update the coil sensitivity maps based upon the most recently reconstructed MR image. After the coil sensitivity coefficients are determined, Eq. (2) may be used to determine the new S.

Embodiments provide for jointly estimating the coefficients a for coil sensitivities and the desired diagnostic MR image x, by finding a solution for Eq. (3) using a least-squares technique. In effect, the image x is reconstructed in accordance with Eq. (3) using the most current coil sensitivity maps. Then, the coil sensitivity maps are updated (e.g., coefficients of the respective coil sensitivity maps are updated) in accordance with Eq. (3) and using the latest reconstructed MR image.

As illustrated by, for example, Eq. (3), embodiments of the present invention in some aspects integrate the image estimation, such as that described in the '447 patent in relation to JSENSE, with compressed sensing as described, for example, in Lustig et al.

The image reconstruction in accordance with Eq. (3), when iteratively performed as described in relation to operation 210 below, yields improved complete reconstructed MR images when compared to techniques including the '447 patent and Lustig et al. FIGS. 3-5 show some examples of improved coil sensitivity and diagnostic images obtained according to certain embodiments in comparison with images based upon conventional techniques.

In contrast to embodiments of the present invention, the '447 patent requires solving joint update of image and sensitivity using an L2-norm minimization problem that may be represented as shown in Eq. (5).

$$\operatorname*{argmin}_{a_\ell, x} \|d_\ell - E(a_\ell)x\|_2^2, \text{ all } \ell \qquad (5)$$

where d represents MR data acquired from a scan, E represents an operator that integrates both the Fourier transform and estimated coil sensitivities estimated, and x represents the MR image being developed.

Lustig et al. describes, for example, a non-linear image reconstruction appropriate for compressed sensing as shown in Eq. (6).

$$\text{minimize } \|\Psi x\|_1 + \alpha TV(x) \text{ s.t. } \|F_u x - y\|_2 < \epsilon \qquad (6)$$

where x represents the MR image being developed, $\Psi$ represents the linear operator that transforms from pixel representation into a sparse representation, $F_u$ represents an undersampled Fourier transform, y represents the measured k-space data from the scan, and $\epsilon$ is a threshold parameter to control the fidelity of the reconstruction.

The inventors of the herein subject matter recognized that, in effect, the JSENSE technique and the compressed sensing techniques can be integrated in a manner that improves over each of them taken individually by using, instead of the image reconstruction step proposed in the JSENSE technique, an image reconstruction which, in addition to considering the difference between the measured data and E(a)x, as done in JSENSE, also considers the sparsification (i.e., applying a predetermined sparsifying transform) of x. The inclusion of the $TV_3D$ in Eq. (3) also imposes minimization of another penalty, such as, for example, the sum of the absolute variations in x when a finite-differences transform is used as the sparsifying transform.

Eq. (3) may be described as combining sensitivity estimation and compressed sensing such that image reconstruction at operation 208 in embodiments jointly estimates coefficient a of the polynomial model of the coil sensitivities and image x in order to minimize the difference between measured k-space values and E(a)x such that image x is the most compressible by sparsifying transform $\Psi$ and the summation gradient of the image x along each direction PE, SE and FE is minimized.

In contrast to the technique described in the '487 patent, Eq. (3) does not require solving joint update images and sensitivity using the L2-norm minimization problem expressed in the form of Eq. (5). Instead, embodiments integrate the image estimation into the compressed sensing step, or in other words, Eq. (5) is considered as corresponding to the data consistency term in compressed sensing.

According to embodiments, any method that seeks for a global minimum for a constrained convex L1 minimization problem can be used to solve Eq. (3). In some embodiments, a non-linear conjugate gradient technique is used.

In contrast to the technique described in the '487 patent, the disclosed methods do not require complex computation. The estimation of the polynomial coefficients a is coil independent, and thus can be distributed into mufti-core GPU and compute simultaneously by parallel-computing technique. Few iterations are needed for process 200. The techniques used in certain embodiments that are exemplified in the abdominal imaging require 2-3 iterations in 206-208.

The disclosed method can be applied to any other MR image reconstruction applications e.g. dynamic cardiac cine imaging, MR perfusion imaging, parametrical—weighted MR imaging, etc.

In addition, one or more other constraints can be incorporated into Eq. (3) by adding additional terms subject to different applications.

At operation 210, it may be determined if the complete MR image x is of satisfactory quality. According to some embodiments, the determination is based upon whether the image x has been changed beyond a predetermined threshold amount between the previous iteration and the current iteration of process 200. The threshold may be configurable, and a small value such as $10^{-6}$ may be provided as the threshold. In some exemplary implementations, process 200 iterated two or three times before it converged (e.g.; the difference between image x of successive iterations becoming smaller than a configured threshold), and in other exemplary implementations different number of iterations were used before convergence. According to some other embodiments, the determination may be based upon operator input. After operation 206 is completed, the system may display the reconstructed image x to the operator, who, after visually evaluating the displayed image, may indicate to the system whether or not the image x is of satisfactory quality.

If either the automatic convergence detection or the operator indicates that the image x is not of satisfactory quality (e.g., has not converged), then the process 200 continues to operation 206 so that operations 206-210 can be iterated until subsequently at operation 208 it is determined that the image x has a satisfactory level of quality.

If either the automatic convergence detection or the operator indicates that the image x have satisfactory quality (e.g., has converged), then the process 200 proceeds to operation 212.

At operation 212, the final reconstructed diagnostic MR image is output. The image may be output to a display, to a storage, and/or to a transmitting device to be stored and/or displayed remotely.

After operation 212, process 200 may terminate.

Process 200 was described above, as a process in which the sensitivity update by 3D JSENSE or similar technique, is followed by the compressed sensing. However, in some other embodiments, the compressed sensing may be followed by the sensitivity update.

The above described process 200 provides, in some embodiments, for 3D radial compressed sensing with modulated sensitivity encoding in image reconstruction. It provides for a 3D polynomial parametric model on sensitivity, and introducing degree of uncertainty in sensitivity estimation. The sensitivity function and the images are regarded as unknowns.

Process 200 also provides for regularization terms to further smooth out the image and sharpening the feature edge. The 3D total variation regularization terms provide for, among other things, preserving important clinical details such as structure edge information while removing unwanted system noise. For example, the de-noising power may be configurable by tuning $\lambda_1$ such that larger $\lambda_1$ values (e.g., stronger role for $\lambda_1$) causes the result to have smaller total variation at the expense of being more smooth (e.g., oversmooth) image. Process 200 also provides for solving complex problems by making locally optimal choices within each iteration and iteratively converging towards a globally optimal solution.

In some embodiments, a reconstruction and processing package to reconstruct images from 3D acquisitions, and a sensitivity estimation package to accurately obtain coil sensitivity maps in accordance with process 200, may be constructed.

Although the above embodiments were described primarily with respect to JSENSE described in the '447 patent, other methods to jointly estimate image and sensitivity can be used to replace JSENSE. An example method that may be used in embodiments instead of JSENSE is described in Martin Uecker et al., "Image reconstruction by regularized nonlinear inversion—Joint estimation of coil sensitivities and image content". Magn. Reson. Med., 60(3): pp 674-682, 2008, and Jens Frahm et al. "Method and device for reconstructing a sequence of MR images using a regularized nonlinear inverse reconstruction process", European Patent WO 2011116785 A8, both of which are incorporated by reference in their respective entireties.

Moreover, although the embodiments describe a 3D radial acquisition, it will be understood that the subject matter herein is applicable to 2D, and to any other MR image reconstruction applications with any arbitrary sampling trajectory that can yield a sparse sampling with incoherent artifacts. In some embodiments, the Nyquist sampling rate may be about 40 times the sampling rate of the sparse sampling with incoherent artifacts. Any MR imaging applications that seeks to accelerate the acquisition process by reducing sampling in k-space in embodiments. Example sampling patterns that may be used in certain embodiments may include spiral scanning trajectory, 2D Poisson Disk sampling trajectory on PE-SE plane, Slice-wise 1D Gaussian distribution random sampling.

In some embodiments, the reconstruction can be run in the background automatically with preset reconstruction parameters. A graphical user interface (GUI) can be activated for optimizing the reconstruction parameters of the proposed method by advanced users or operators. Reconstruction parameters may include, for example, $\lambda_1$ and $\lambda_2$ used in Eq. (3) and the convergence threshold. In some embodiments, an operator specific mode may be provided for visualizing the converging of the process 200 via popup images during each iteration so that an optimized solution can be selected by the operator.

FIG. 3 illustrates the improvement in the sensitivity estimation, starting with the same initial sensitivity, between a conventional sensitivity estimation technique SENSE and certain embodiments. 302 illustrates an initial coil sensitivity map. The corresponding image 304 was obtained by using a conventional technique described in Walsh et al, "Adaptive Reconstruction of Phased Array MR Imagery". Magn. Reson. Med., 43:682-690, 2000. The corresponding image 306 obtained using an embodiment illustrates a highly smoothed sensitivity compared to the illustrated conventional technique. The initial sensitivity estimated from low resolution images obtained from the densely sampled center k-space has spatially dependent noise that is large at the lung area where the image intensity is low. The sensitivity estimated using conventional techniques described in Walsh et al has less noise but results in truncation artifacts. The map estimated based upon certain embodiments visually agrees with the smooth variation of the electromagnetic field with no noise or truncation effect. Images 312, 314 and 316 illustrate another example comparison between an initial coil sensitivity, an image using a conventional method, and a coil sensitivity obtained using an embodiment.

Figures 4A, 4B:
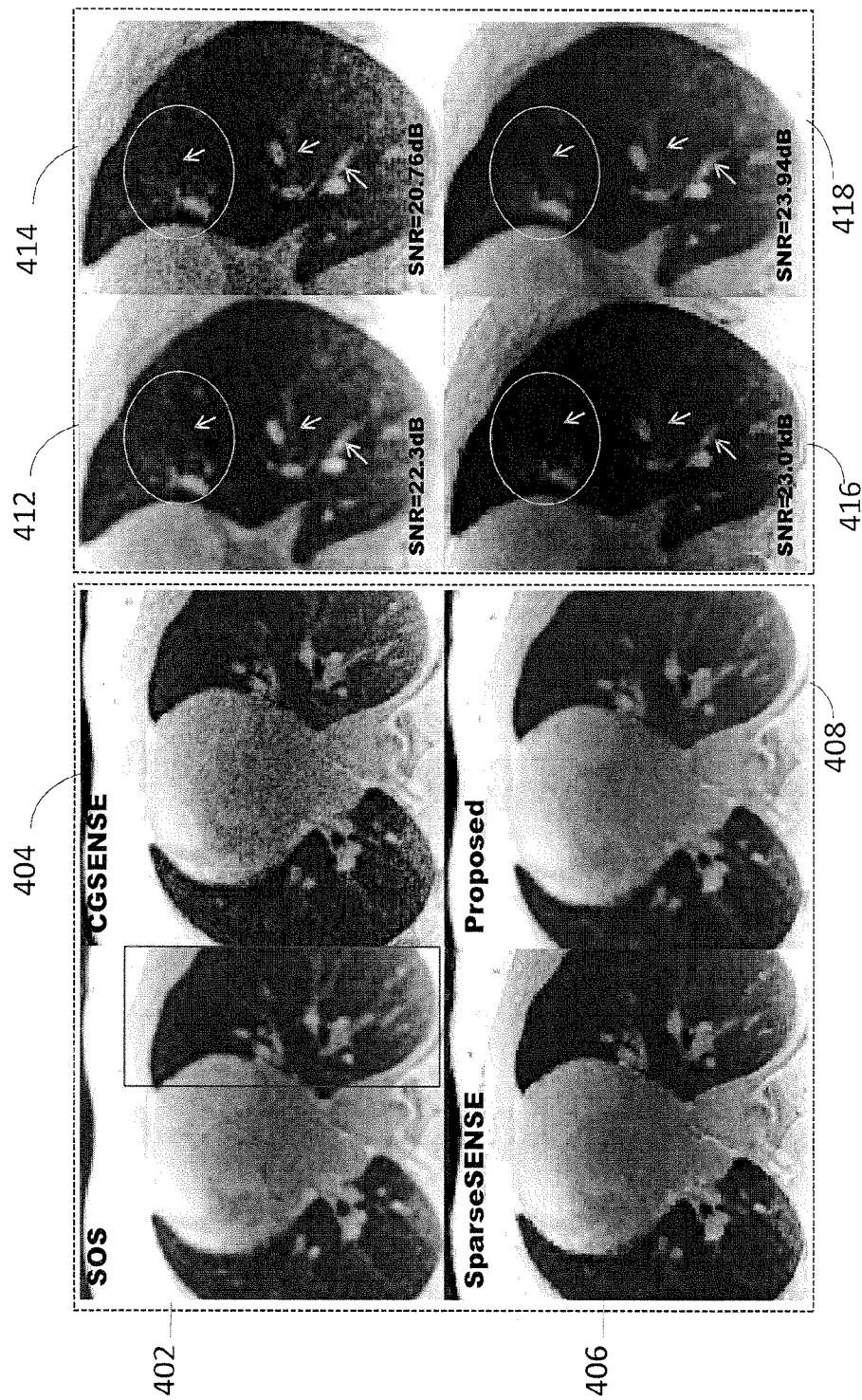
FIGS. 4A-4B provide example illustrations of reconstructed MRI images showing improvements in the signal-to-noise ratio obtained according to some embodiments.

FIGS. 4A-B illustrates improvement of the signal to noise ratio (SNR) in the reconstructed images, starting from the same sum-squares-image (SoS) 402 and 412, between CG SENSE, CS with SENSE and certain embodiments. CG SENSE and CS with SENSE are described respectively in Pruessmann and the '024 patent. In FIG. 4A, the comparison images are shown for the entire lung, where some features are missing in the CS with SENSE image 406. FIG. 4A also illustrates that the CG SENSE 404 technique shows more features than the CS with SENSE 406 technique, but amplifies the noise. The image reconstructed according to embodiments (408) show overall improvements over either of the other techniques.

FIG. 4B illustrates zoomed images of the right lung. The arrows in images 412-418 indicate features that are visible in the SoS image 412, but are either barely visible or not visible in the corresponding CG SENSE 414 and SparseSENSE images 416. The circle in images 412-418 indicate over-smoothing artifacts caused by using compressed sensing. Image 418, generated according to an embodiment, preserves all the key features of the lung (bronchi) while smoothing out most background noise thereby providing better visibility of features without over smoothing. Quantitatively, the image 418 according to an embodiment achieves the highest SNR among all techniques for which results are shown.

Figure 5B:
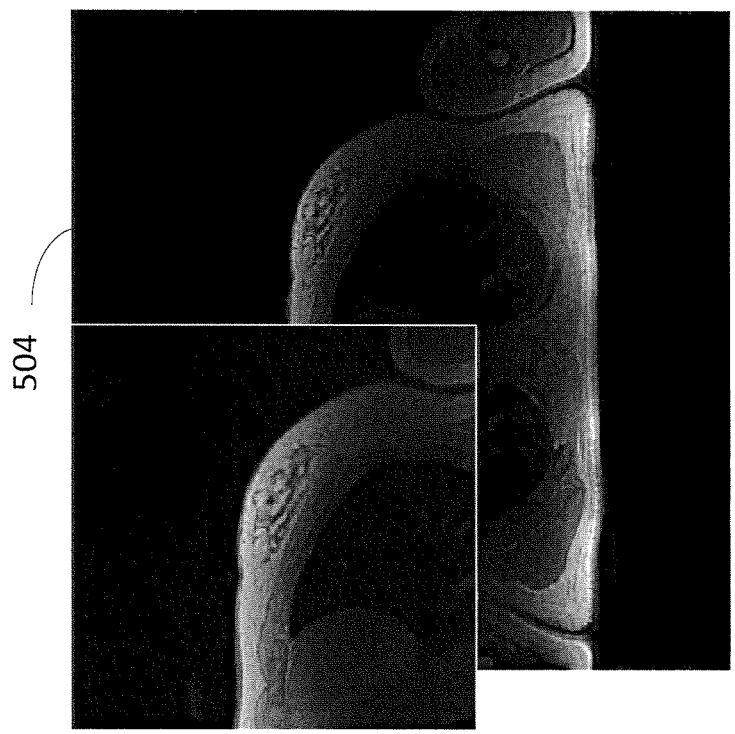
FIGS. 5A-5B provide example illustrations of reconstructed MRI images with improved deblurring, edge sharpening and other effects, obtained according to some embodiments.
Figure 5A:
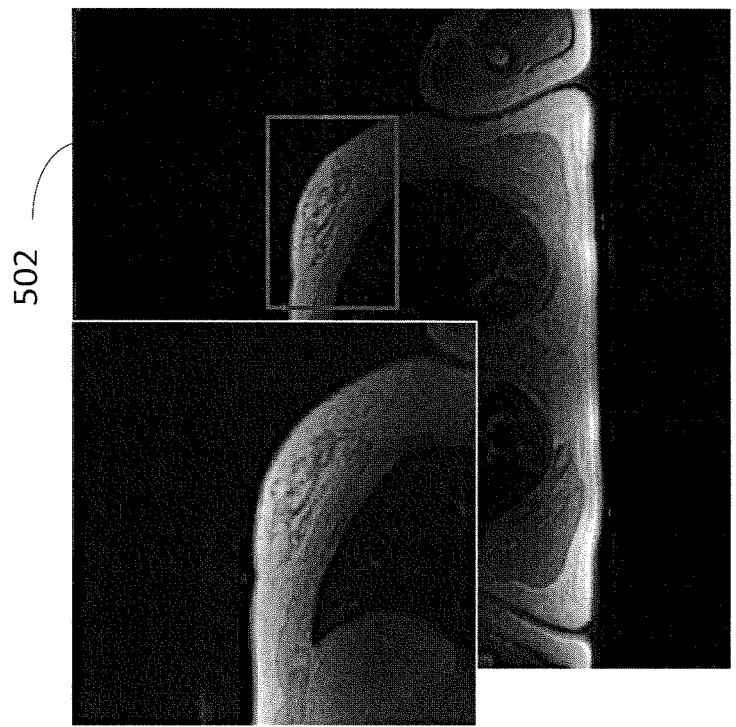

FIGS. 5A-B illustrate a comparison between a first image 502 reconstructed using CG SENSE and a second image 504 reconstructed according to an embodiment. The second image 504, as shown in the image and its zoomed view, displays improved deblurring, edge sharpening compared to the first image 502, as shown in the image and its corresponding zoomed view.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system comprising:
    an MRI gantry including static and gradient magnetic field generators, at least one radio frequency (RF) coil and RF transmitter and receiver circuits configured to transmit nuclear magnetic resonance (NMR) RF excitation pulses into an imaging volume and to receive NMR RF response signals from patient tissue located in the imaging volume; and at least one control circuit connected to said gradient magnetic field generators and said RF transmitter and receiver circuits, said control circuits being configured to:

(a) perform a sparse acquisition of k-space data corresponding to NMR signals received by each RF coil;

(b) estimate, using the acquired sparse k-space data, a sensitivity map for each RF coil;

(c) reconstruct an MR image using compressed sensing based upon the at least one sensitivity map by minimizing a predetermined function which is based upon the MR image and coefficients of the at least one sensitivity map;

(d) update the at least one sensitivity map by minimizing the predetermined function;

(e) iteratively perform the reconstruct and the update processes (c) and (d) until at least one of the following conditions occur: (1) an operator selects to end iterating, or (2) the predetermined function converges; and (f) output the reconstructed MR image when at least one of the conditions occur.

2. The MRI system according to claim 1, wherein the update is based upon a polynomial function of sensitivities of the at least one RF coils.

3. The MRI system according to claim 2, wherein estimate is based upon the polynomial function.

4. The MRI system according to claim 3, wherein the polynomial function, when applied to the sensitivity map for each of the at least one RF coils, performs smoothing by reducing sharp differences between pixels located at outer edges of a reconstructed image.

5. The MRI system according to claim 1, wherein the predetermined function minimizes, at each iteration, a sum of at least (1) a difference between the acquired k-space data and the reconstructed MR image, and (2) a sparsification of the reconstructed MR image.

6. The MRI system according to claim 5, wherein the sum further includes (3) a penalty for a sum of absolute variations in the reconstructed MR image.

7. The MRI system according to claim 1, wherein the compressed sensing includes finding a minimum sparsification of the reconstructed image such that a difference between the acquired k-space data and the reconstructed MR image is less than a configured threshold.

8. The MRI system according to claim 1, wherein the compressed sensing includes finding a minimum sparsification of the reconstructed MR image and a minimum sum of absolute variations in the reconstructed MR image such that a difference between the acquired k-space data and the reconstructed MR image is less than a configured threshold.

9. The MRI system according to claim 1, wherein the predetermined function includes $$\arg\min_{a_l,x} \Sigma_{l=1}^{c} \|d - E(a_l)x\|_2 + \lambda_1 \|\phi x\|_1$$

wherein $\phi$ represents a sparsifying transform, wherein d represents the acquired k-space data, wherein E represents an operator which integrates both the Fourier transform with a specified k-space data acquisition trajectory and a function representing sensitivities of the at least one RF coil, wherein x represents the reconstructed MR image, wherein C is the number of RF coils including the at least one RF coil, wherein $a_l$ represents the sensitivities of RF coil l, and wherein $\lambda_1$ and $\lambda_2$ are predetermined constants.

10. The MRI system according to claim 1, wherein the predetermined function is represented by $$\arg\min_{a_l,x} \Sigma_{l=1}^{c} \|d - E(a_l)x\|_2 + \lambda_1 \|\phi x\|_1 + \lambda_2 TV(x)$$

wherein $\phi$ represents a sparsifying transform, wherein TV represents taking the gradient of the image along at least two of the directions phase encode (PE), frequency encode (FE), and spatial encode (SE), wherein d represents the acquired k-space data, wherein E represents an operator which integrates both the Fourier transform with a specified k-space data acquisition trajectory and a function representing sensitivities of the at least one RF coil, wherein x represents the reconstructed MR image, wherein C is the number of RF coils including the at least one RF coil, wherein $a_l$ represents the sensitivities of RF coil l, and wherein $\lambda_1$ and $\lambda_2$ are predetermined constants.

11. The MRI system according to claim 1, wherein the at least one control circuits are further configure to, after each iteration, display the reconstructed image on a display device and receive an operator input before proceeding to the next iteration.

12. The MRI system according to claim 1, wherein the MRI gantry comprises a plurality of RF coils, and wherein the sparse acquisition is performed in parallel for each of the plurality of RF coils.

13. The MRI system according to claim 1, wherein the sparse acquisition is a radial acquisition.

14. A method comprising:

(a) accessing a sparse acquisition of k-space data corresponding to nuclear magnetic resonance (NMR) signals received by each Radio Frequency (RF) coil of a MRI system which includes static and gradient magnetic field generators, at least one RF coil and RF transmitter and receiver circuits configured to transmit NMR RF excitation pulses into an imaging volume and to receive NMR RF response signals from patient tissue located in the imaging volume, and at least one control circuit connected to said gradient magnetic field generators; and (b) estimating, using the acquired sparse k-space data, a sensitivity map for each RF coil;

(c) reconstructing an MR image using compressed sensing based upon the at least one sensitivity map by minimizing a predetermined function which is based upon the MR image and coefficients of the at least one sensitivity map;

(d) updating the at least one sensitivity map by minimizing the predetermined function;

(e) iteratively performing the reconstructing and the updating steps (c) and (d) until at least one of the following conditions occur: (1) an operator selects to end iterating, or (2) the predetermined function, converges; and (f) outputting the reconstructed MR image when at least one of the conditions occur.

15. The method according to claim 14, wherein the updating is based upon a polynomial function of sensitivities of the at least one RF coils.

16. The method according to claim 14, wherein the predetermined function is directed to minimizing, at each iteration, a sum of at least (1) a difference between the acquired k-space data and the reconstructed MR image, and (2) a sparsification of the reconstructed MR image.

17. The method according to claim 13, wherein the compressed sensing includes finding a minimum sparsification of the reconstructed image such that a difference between the acquired k-space data and the reconstructed MR image is less than a configured threshold.

18. The method according to claim 13, wherein the predetermined function is represented by $$\arg\min_{a_l,x} \Sigma_{l=1}^{C} \|d - E(a_l)x\|_2 + \lambda_1 \|\phi x\|_1$$

wherein φ represents a sparsifying transform, wherein d represents the acquired k-space data, wherein E represents an operator which integrates both the Fourier transform with a specified k-space data acquisition trajectory and a function representing sensitivities of the at least one RF coil, wherein x represents the reconstructed MR image, wherein C is the number of RF coils including the at least one RF coil, wherein $a_l$ represents the sensitivities of l and wherein $\lambda_1$ and $\lambda_2$ are predetermined constants.

19. A non-transitory computer readable storage medium having stored thereon instructions which, when executed by one or more control circuits controls a magnetic resonance imaging (MRI) system to perform operations comprising:

(a) accessing a sparse acquisition of k-space data corresponding to nuclear magnetic resonance (NMR) signals received by each radio frequency (RF) coil in an MRI system which includes static and gradient magnetic field generators, at least one RF coil configured to transmit NMR RF excitation pulses into an imaging volume and to receive NMR RF response signals from patient tissue located in the imaging volume and at least one control circuit;

(b) estimating, using the acquired sparse k-space data, a sensitivity map for each RF coil;

(c) reconstructing an MR image using compressed sensing based upon the at least one sensitivity map by minimizing a predetermined function which is based upon the MR image and coefficients of the at least one sensitivity map;

(d) updating the at least one sensitivity map by minimizing the predetermined function;

(e) iteratively performing the reconstructing and the updating steps (c) and (d) until at least one of the following conditions occur: (1) an operator selects to end iterating, or (2) the predetermined function converges; and (f) outputting the reconstructed MR image when at least one of the conditions occur.

* * * * *